(12) United States Patent
Kim et al.

(10) Patent No.: US 6,822,323 B1
(45) Date of Patent: Nov. 23, 2004

(54) SEMICONDUCTOR PACKAGE HAVING MORE RELIABLE ELECTRICAL CONDUCTIVE PATTERNS

(75) Inventors: Byoung Jin Kim, Kyounggi-do (KR); Doo Hyun Park, Seoul (KR); Jae Wook Seok, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/435,888

(22) Filed: May 12, 2003

(51) Int. Cl.⁷ .................... H01L 23/12; H01L 23/053
(52) U.S. Cl. .................... 257/700; 257/698; 257/787
(58) Field of Search ............................... 257/684, 687, 257/698, 700, 738, 774, 779, 780, 782, 784, 787

(56) References Cited

U.S. PATENT DOCUMENTS 6,617,680 B2 * 9/2003 Chien-Chih et al. ........ 257/698

* cited by examiner

Primary Examiner—Hoai Pham
(74) Attorney, Agent, or Firm—Weiss, Moy & Harris, P.C.

(57) ABSTRACT

A semiconductor package has a substrate comprising a resin layer of an approximate planar plate, a die pad coupled at a top surface of a center area of the resin layer and having a printed photo imaging type protective layer thereon and a plurality of electrically conductive patterns, on which the photo imaging type protective layer and a thermosetting protective layer are printed in a consecutive order, formed at a periphery of the die pad. A semiconductor die is coupled to the photo imaging type protective layer on the die pad of the substrate by an adhesive. A plurality of conductive wires is used for electrically connecting the semiconductor die to the electrically conductive patterns. An encapsulant is used for covering the semiconductor die, the conductive wires and the surface of thermosetting protective layer on the electrically conductive patterns in order to protect them from the external environment. A plurality of contacts are coupled to the electrically conductive patterns of the substrate.

19 Claims, 3 Drawing Sheets

SEMICONDUCTOR PACKAGE HAVING MORE RELIABLE ELECTRICAL CONDUCTIVE PATTERNS

BACKGROUND OF THE INVENTION

1. Field of the Invention

This invention relates to semiconductor packages, and, more specifically, to a semiconductor package and a method of manufacturing having more reliable electrical conductive patterns.

2. Description of the Related Art

A conventional semiconductor package includes a substrate of an approximate planar plate having a plurality of conductive patterns at the top and bottom surfaces of a resin layer thereof. A semiconductor die is bonded to the die pad of the substrate by means of an adhesive. A plurality of conductive wires is used for electrically connecting the semiconductor die to the electrically conductive patterns of the substrate. An encapsulant is used for covering the semiconductor die and the conductive wires. A plurality of solder balls is fused to the electrically conductive patterns of the substrate.

The plurality of conductive patterns of the substrate consists of the top and bottom surfaces of the resin layer, respectively, in order to allow the conductive wires to be bonded and the solder balls to be fused. A photo imaging type protective layer of a predetermined thickness, which is made of an epoxy and an acrylate, is screen-printed and hardened on the surfaces of the resin layer as well as the electrically conductive patterns. The photo imaging type protective layer is used to protect the electrically conductive patterns from the external moisture, dust and mechanical impact or the like. Here, the photo imaging type protective layer is not formed in the wire bonding regions nor the solder balls fusing regions. The reason for use of the photo imaging type protective layer, as described above, is that it allows each electrically conductive pattern to be insulated. The photo imaging type protective layer is irradiated by a ray of a predetermined wavelength and heat, it is then rapidly cured from a liquid phase to a solid phase by the reaction of a photo reactant existing in the protective layer. This produces a superior and convenient operation of efficiency.

Meanwhile, in the semiconductor package which uses such a substrate, a demand on the physical reliance of the package has tended to gradually increase. That is, according to a tendency of the semiconductor package to be integrated and dense, more narrow and thin conductive patterns have been required, Accordingly, many-sided efforts have been advanced in order to solve the above reliance problem of the package.

In the case of the photo imaging type protective layer, which is widely used in the substrate at present as described above, there are advantages in that it has superior insulation and an easy formation procedure of patterns. However, since the electrically conductive patterns are thin and narrow, cracks or other damage to the electrically conductive patterns can occur, owing to a pressure generated from the encapsulating or singulating process of the semiconductor package. This causes the reliance of the package to be lowered. That is, the electrically conductive patterns contacted indirectly with a mold, during encapsulating process, can be cracked or damaged. Also, the electrically conductive patterns cut by a cutter, which is located at the edge of the substrate during the singulating process, can be cracked or damaged.

Since the photo imaging type protective layer is easily damaged by mechanical impact, there is a problem in that the electrically conductive patterns inside the protective layer can be easily contaminated or damaged. Here, because a property of the matter, an acrylate, which is one of the elements of the photo imaging type protective layer, is soft as well as brittle, the photo imaging type protective layer can be easily damaged, as described above. That is, the property of matter of an epoxy forming the protective layer can withstand an external force very well. However, the acrylate is easily broken by external forces.

A BRIEF SUMMARY OF THE INVENTION

A semiconductor package has a substrate comprising a resin layer of an approximate planar plate, a die pad coupled at a top surface of a center area of the resin layer and having a printed photo imaging type protective layer thereon and a plurality of electrically conductive patterns, on which the photo imaging type protective layer and a thermosetting protective layer are printed in a consecutive order, formed at a periphery of the die pad. A semiconductor die is coupled to the photo imaging type protective layer on the die pad of the substrate by an adhesive. A plurality of conductive wires is used for electrically connecting the semiconductor die to the electrically conductive patterns. An encapsulant is used for covering the semiconductor die, the conductive wires and the surface of thermosetting protective layer on the electrically conductive patterns in order to protect them from the external environment. A plurality of contacts are coupled to the electrically conductive patterns of the substrate.

The present invention is best understood by reference to the following detailed description when read in conjunction with the accompanying drawings.

BRIEF DESCRIPTION OF THE DRAWINGS

Common reference numerals are used throughout the drawings as well, detailed descriptions are used to indicate like elements.

A DETAILED DESCRIPTION OF THE INVENTION

Figure 1:
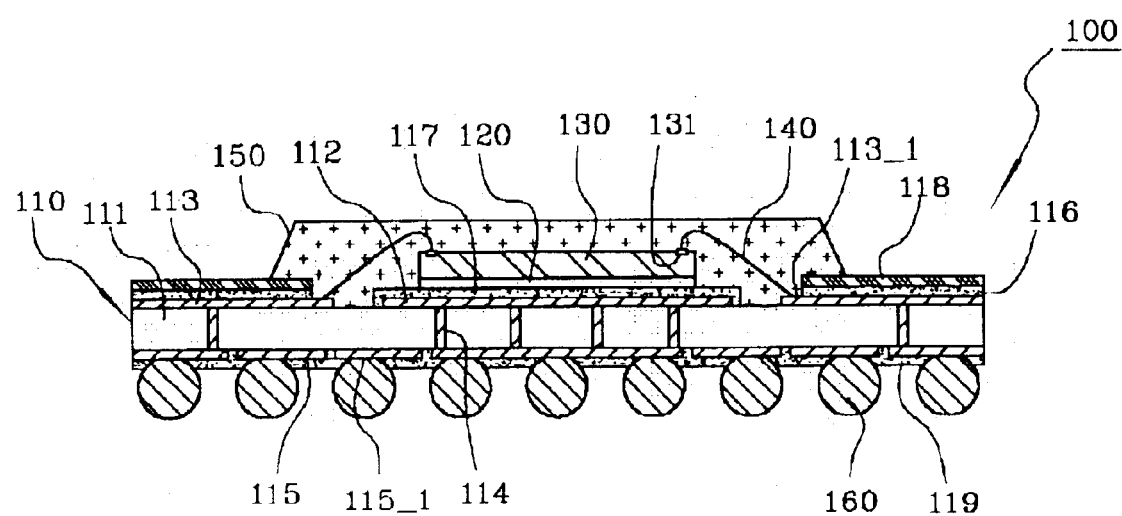
FIG. 1 is a sectional view of a semiconductor package according to one embodiment of the present invention.

Referring to FIG. 1, a sectional view of a semiconductor package 100 according to one embodiment of the present invention is illustrated.

As shown in the drawing, the semiconductor package 100 includes a substrate 110 of an approximate planar plate having a die pad 112 at the center thereof and a plurality of electrically conductive patterns 113 located at the periphery of the die pad 112. A semiconductor die 130 is bonded to the die pad 112 of the substrate 110. A plurality of conductive wires 140 are provided for electrically connecting the semiconductor die 130 to the substrate 110. An encapsulant 150 is used for covering the semiconductor die 130 located at the top surface of the substrate 110 and the conductive wires 140 in order to protect them from the external environment. A plurality of solder balls 160 is fused to the bottom surface of the substrate 110 and mounted to the external device.

The substrate 110 includes a thermosetting resin layer 111 of an approximate planar plate. The die pad 112 of a predetermined area is formed at the top surface of the center of the resin layer 111. A plurality of electrically conductive patterns 113 is formed at the periphery of the die pad 112. A plurality of other electrically conductive patterns 115 are formed at the bottom surfaces of the resin substrate 111. A plurality of conductive vias 114 is used for electrically connecting the electrically conductive patterns 113 and 115, which are formed at the top and bottom surfaces of the resin layer 111, to each other. Here, the die pad 112 and the electrically conductive patterns 113 and 115 may be a conventional copper (Cu) or its equivalent A photo imaging type protective layer 117 is printed on the surface of the die pad 112 which is to be hardened. Another photo imaging type protective layer 116 is printed on the electrically conductive patterns 113 formed at the periphery of the die pad 112 which is also to be hardened. Moreover, another further photo imaging type protective layer 119 is printed on the electrically conductive patterns 115 which is formed on the bottom surface of the resin layer 111, which is to be hardened. Here, bonding regions 113 of the conductive wires 140 that are among the electrically conductive patterns 113 formed at the top surface of the resin layer 111 and the solder ball 160 fusing regions 117 that are among the electrically conductive patterns 115 formed at the bottom surface of the resin layer 111 are opened through the photo imaging type protective layers 116 and 119, respectively.

In the meantime, a thermosetting protective layer 118 is printed on the photo imaging type protective layer 116 formed at the electrically conductive patterns 113, which is located on the top surface of resin layer 111 of the substrate 110, which is to be hardened. This structure can be obtained by screen printing and hardening the thermosetting protective layer 118 on the photo imaging type protective layer 116 which covers the electrically conductive patterns 113, which are formed at the periphery of the die pad 112, after completely manufacturing a conventional substrate 110. Here, a curing process of high temperature occurs after the forming of the thermosetting protective layer 118, so that the thermosetting protective layer 118 is completely adhered to the photo imaging type protective layer 116. The thermosetting protective layer 118 generally uses a hard epoxy. However, the thermosetting protective layer 118 may use S-500 which is manufactured by Taio Ink Company. Since the thermosetting protective layer 118 is superior to that of the general photo imaging type protective layer 116 in terms of tensile strength and break strength, it can protect the electrically conductive patterns 113 formed at the lower part thereof from the external environment, in a more stable manner. That is, although the electrically conductive patterns 113 are thin and narrow, which are attributed to the thermosetting protective layer 118 having a superior break strength which is further formed on the photo imaging type protective layer 116 covering the patterns 113, it can prevent the electrically conductive patterns 113 from being cracked or damaged, owing to the mechanical impact or pressure during the encapsulating or singulating process of semiconductor package. Also, it is preferable that the thickness of the thermosetting protective layer 118 is the same as or similar to that of the photo imaging type protective layer 116 or 117. Furthermore, the thermosetting protective layer can be formed on the photo imaging type protective layer 117 located on the die pad 112. Thus the present invention is not limited to this structure.

The substrate 110 of the present invention is described on the basis of the resin layer having electrically conductive patterns 113 and 116 on the top and bottom surfaces thereof. However, the substrate may also be a typical film, tape or the like. Such characteristics of the substrate, as described above, may be applied to all substrates, as will be described later.

The semiconductor die 130 is bonded to the die pad 112 of the substrate 110, that is, the photo imaging type protective layer 117 by means of an adhesive 120. Here, a plurality of input and output pads 131 for signaling is formed on the top surface of the semiconductor die 130.

The bond pads 131 of the semiconductor die 130 and the electrically conductive patterns 113, that is, the wire bonding regions 113_1, which are formed on the top surface of the substrate 110, are electrically connected to each other by means of the conductive wires 140. The material of the conductive wire 140 may be a conventional gold wire, an aluminum wire or its equivalent. However, the present invention is not limited to any material of the conductive wire.

The encapsulant 150 covers the semiconductor die 130 located on the top surface of the substrate 110 and the conductive wires 130. The encapsulant 150 is used to separate and protect the semiconductor die 130 and the conductive wires 130 from the external environment. In the case where the encapsulant 150 is formed by use of a mold, the mold presses the top surface of the substrate 110 located on the outside of the encapsulant 150 at a high pressure, in order that the encapsulating material does not flow to the outside of the encapsulant 150. That is, the thermosetting protective layer 118 located at the periphery of the die pad 112 is pressed by the mold at a high pressure. Since the thermosetting protective layer 118 as well as the photo imaging type protective layer 116 having a superior tensile strength and break strength are further formed at the pressed region, it can protect the electrically conductive patterns 113 formed at the inside of the photo imaging type protective layer 116, in a stable manner. That is, the thermosetting protective layer 118 can absorb and alleviate the pressure and impact of the mold, thereby protecting the electrically conductive patterns 113. Similarly, in the singulating process, less stress is applied to the electrically conductive patterns 113 in the vicinity of the singulating region, so that it can be protected in a stable manner.

The solder balls 160 are fused to the electrically conductive patterns 115, that is, the solder ball bonding region 115_1, which is exposed to lower part of the substrate 110 through the photo imaging type protective layer 119 formed at the bottom surface of the substrate 110. The solder balls 160 are mounted to an external device beforehand through a reflowing process, in order to electrically connect the signals of the semiconductor package 100 to the external device.

Figure 2:
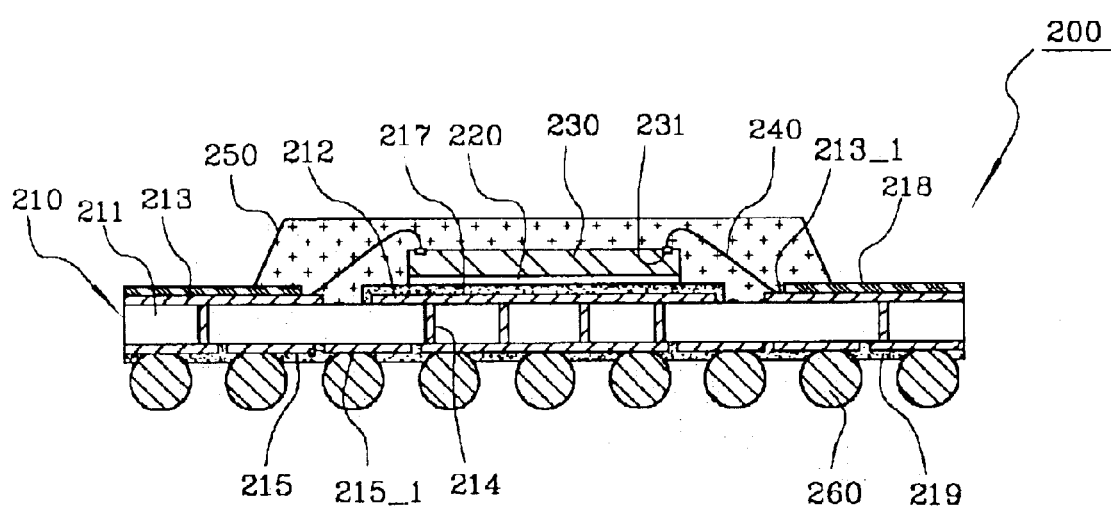
FIG. 2 is a sectional view of a semiconductor package according to another embodiment of the present invention.

Referring to FIG. 2, a sectional view of a semiconductor package 200 according to another embodiment of the present invention is illustrated. Since the semiconductor package 200 as shown in FIG. 2 is similar to the semiconductor package 100 of FIG. 1A, it will be described around those differences.

As shown in the drawing, a substrate 210 includes a resin layer 211 of an approximate planar plate. A die pad 212 of a predetermined area is formed at the top surface of the center of the resin layer 211. A plurality of electrically conductive patterns 213 is formed at the periphery of the die pad 212. A photo imaging type protective layer 217 is printed on the surface of the die pad 212, which is to be hardened. A thermosetting protective layer 218 is printed directly on the electrically conductive patterns 213 formed at the periphery of the die pad 212, which is also hardened. Here, preferably, the thickness of the photo imaging type protective layer 217 is similar to or the same as that of the thermosetting protective layer 218, so that the entire of the substrate 210 has a superior evenness. Here, the photo imaging type protective layer 217 is irradiated by a ray of a predetermined wavelength, which is to be hardened, after the screen printing process, while the thermosetting protective layer 218 is cured at a predetermined temperature, which is to be hardened, after the screen printing process. The present invention is not limited to the order of the photo imaging type protective layer 217 and the thermosetting protective layer 218 in the way they are formed.

In the meantime, a mold directly presses down the top surface of the thermosetting protective layer 218 at a high pressure during the encapsulating process, so that stress is applied to the electrically conductive patterns 213 located on the lower part of the thermosetting protective layer 218. However, since the thermosetting protective layer 218 has a high tensile strength and a superior break strength, it prevents the stress of the mold from being directly transmitted to the electrically conductive patterns 213, thereby preventing cracking or damage of the electrically conductive patterns 213. Similarly, in the singulating process, the impact is transmitted to the electrically conductive patterns 213 at a minimum, thereby improving the reliance of the electrically conductive patterns 213 thereof.

Figure 3:
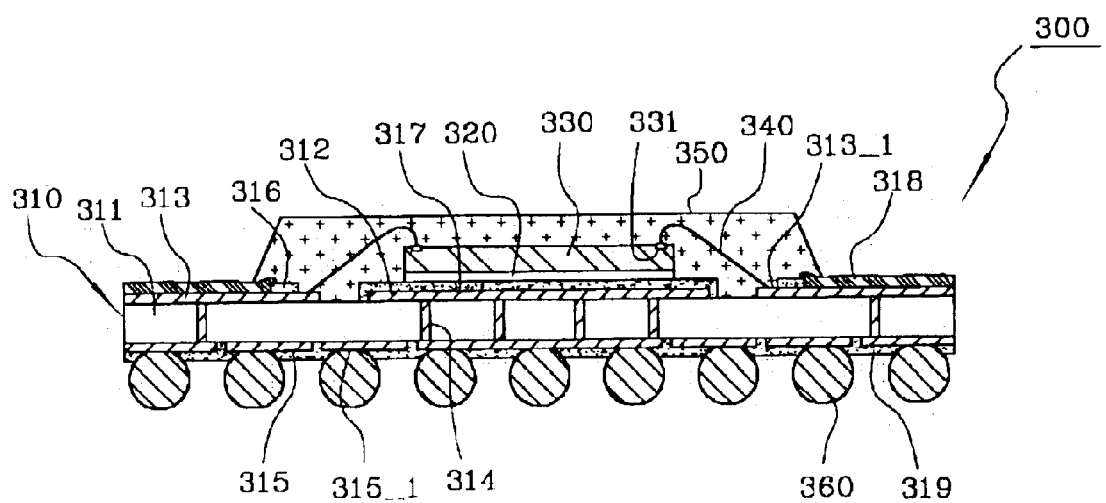
FIG. 3 is a sectional view of a semiconductor package according to another further embodiment of the present invention.

Referring to FIG. 3, a sectional view of a semiconductor package 300 according to another embodiment of the present invention is illustrated. Since the semiconductor package 300 as shown in FIG. 3 is similar to the semiconductor package 100 of FIG 1A, it will be described around those differences.

As shown in the drawing, a substrate 310 includes a resin layer 311 of an approximate planar plate. A die pad 312 of a predetermined area is formed at the top surface of the center of the resin layer 311 and a plurality of electrically conductive patterns 313 is formed at the periphery of the die pad 312. Also, a photo imaging type protective layer 317 is printed on the surface of the die pad 312, which is to be hardened, as well a photo imaging type protective layer 316 which is partially printed on the electrically conductive patterns 313 formed at the periphery of the die pad 312, which is to be hardened. That is, the photo imaging type protective layer 316 is printed on only a partial region of the electrically conductive patterns 313, which is located on the inside of an encapsulant 350, except for wire-bonding regions 313_1. Also, a thermosetting protective layer 318 is printed on a part of the photo imaging type protective layer 316 and the electrically conductive patterns 313 located on the outside of the photo imaging type protective layer 316, which is to be hardened. That is, the thermosetting protective layer 318 is printed from the inside of the encapsulant 350 to the electrically conductive patterns 313 located on the outside of the encapsulant 350. Accordingly, the photo imaging type protective layer 316 is printed in the vicinity of the wire-bonding regions 313_1, thereby easily forming the patterns. Also, the thermosetting protective layer 318 having a superior tensile strength and break strength is printed on inside part of the encapsulant 350 and the entire outside of the encapsulant 350 except for the wire-bonding regions 313_1, so that the electrically conductive patterns 313 located on the upper part of the substrate 310 can be protected from the external mechanical impact. Here, in the forming process of the protective layer, after screen-printing the photo imaging type protective layers 316 and 317 on only the vicinity of the periphery of the wire-bonding regions 313_1 and the die pad 317, the photo imaging type protective layers 316 and 317 are irradiated by a ray of a predetermined wavelength, which is to be hardened. Thereafter, the thermosetting protective layer 318 is cured at a predetermined temperature to be hardened, after the screen printing process, thereby covering the part of the photo imaging type protective layer 316 as well as the entire outside regions of the photo imaging type protective layer 316.

Therefore, the patterns are easily formed in the vicinity of the wire-bonding regions 313_1 by using the photo imaging type protective layer 316. Also, the thermosetting protective layer 318 is printed on the exterior region of the encapsulant 350, to which the external impact is applied by means of the mold, to be hardened, so that the substrate 310 has a high break strength.

This disclosure provides exemplary embodiments of the present invention. The scope of the present invention is not limited by these exemplary embodiments. Numerous variations, whether explicitly provided for or implied by the specification, such as variations in structure, dimension and type of material and the manufacturing process may be implemented by one who is skilled in the art, in view of this disclosure.

What is claimed is:

1. A semiconductor package comprising:
    a substrate comprising a resin layer of an approximate planar plate, a die pad at a top surface of a center area of the resin layer and having a printed photo imaging type protective layer thereon and a plurality of electrically conductive patterns, on which the photo imaging type protective layer and a thermosetting protective layer are printed in a consecutive order, formed at a periphery of the die pad;
    a semiconductor die coupled to the photo imaging type protective layer on the die pad of the substrate by an adhesive;
    a plurality of conductive wires for electrically connecting the semiconductor die to the electrically conductive patterns;
    an encapsulant for covering the semiconductor die, the conductive wires and the surface of thermosetting protective layer on the electrically conductive patterns in order to protect them from the external environment; and
    a plurality of contacts coupled to the electrically conductive patterns of the substrate.

2. A semiconductor package in accordance with claim 1 wherein the thermosetting protective layer is screen printed and hardened on the photo imaging type protective layer.

3. A semiconductor package in accordance with claim 1 wherein the semiconductor package is cured to adhere the thermosetting protective layer to the photo imaging type protective layer.

4. A semiconductor package in accordance with claim 1 wherein the thermosetting protective layer is an epoxy.

5. A semiconductor package in accordance with claim 1 wherein the contacts are solder balls fused to the electrically conductive patterns of the substrate.

6. A semiconductor package comprising:
    a substrate comprising a resin layer of an approximate planar plate, a die pad at a top surface of a center area of the resin layer and having a printed photo imaging type protective layer thereon and a plurality of electrically conductive patterns, on which thermosetting protective layer is printed, formed at a periphery of the die pad;

a semiconductor die bonded to the photo imaging type protective layer on the die pad of the substrate by an adhesive;

a plurality of conductive wires for electrically connecting the semiconductor die to the electrically conductive patterns;

an encapsulant for covering the semiconductor die, the conductive wires and the surface of thermosetting protective layer on the electrically conductive patterns in order to protect them from the external environment; and a plurality of contacts coupled to the electrically conductive patterns of the substrate.

7. A semiconductor package in accordance with claim 6 wherein a thickness of the photo imaging type protective layer is approximately equal to a thickness of the thermosetting protective layer so the substrate will be level.

8. A semiconductor package in accordance with claim 6 wherein the printed photo imaging type protective layer is irradiated by a ray of a predetermined wavelength.

9. A semiconductor package in accordance with claim 6 wherein the contacts are solder balls fused to the electrically conductive patterns of the substrate.

10. A semiconductor package comprising:

a substrate comprising a resin layer of an approximate planar plate, a die pad at a top surface of a center area of the resin layer and having a printed photo imaging type protective layer thereon and a plurality of electrically conductive patterns, on which the photo imaging type protective layer and a thermosetting protective layer are printed while being horizontally contacted with each other, formed at a periphery of the die pad;

a semiconductor die bonded to the photo imaging type protective layer on the die pad of the substrate by an adhesive;

a plurality of conductive wires for electrically connecting the semiconductor die to the electrically conductive patterns;

an encapsulant for covering the semiconductor die, the conductive wires and the surface of photo imaging type protective and thermosetting protective layer on the electrically conductive patterns in order to protect them from the external environment; and a plurality of contacts coupled to the electrically conductive patterns of the substrate.

11. A semiconductor package in accordance with claim 10, wherein the photo imaging type protective layer is printed on the electrically conductive patterns corresponding to an inside of the encapsulant, which are formed at the periphery of the die pad, as well the thermosetting protective layer is printed on the electrically conductive patterns from an inside of the encapsulant to an entire outside of the encapsulant.

12. A semiconductor package in accordance with claim 10 wherein the contacts are solder balls fused to the electrically conductive patterns of the substrate.

13. A semiconductor package comprising:

a substrate of an approximate planar plate having a plurality of conductive patterns, a die pad at a top surface of a center area of the substrate, and a photo imaging protective layer and a thermosetting protective layer cover the plurality of conductive patterns;

a semiconductor die coupled to the die pad of the substrate by an adhesive; and a plurality of conductive wires for electrically connecting the semiconductor die to the electrically conductive patterns.

14. A semiconductor package in accordance with claim 13 wherein the photo imaging protective layer and a thermosetting protective layer cover the plurality of conductive patterns on a top side of the substrate.

15. A semiconductor package in accordance with claim 13 wherein the photo imaging protective layer and a thermosetting protective layer cover the plurality of conductive patterns on a bottom side of the substrate.

16. A semiconductor package in accordance with claim 13 wherein the photo imaging protective layer and a thermosetting protective layer cover the die pad.

17. A semiconductor package in accordance with claim 13 wherein a thickness of the photo imaging protective layer is approximately equal to a thickness of the thermosetting protective layer.

18. A semiconductor package in accordance with claim 13 wherein the photo imaging protective layer is printed on the die pad and the thermosetting protective layer is screen printed and hardened on the photo imaging type protective layer.

19. A semiconductor package in accordance with claim 13 wherein the semiconductor package is cured to adhere the thermosetting protective layer to the photo imaging type protective layer.

* * * * *